United States Patent
Movchan et al.

(10) Patent No.: US 6,998,172 B2
(45) Date of Patent: *Feb. 14, 2006

(54) THERMALLY-STABILIZED THERMAL BARRIER COATING

(75) Inventors: Boris A. Movchan, Kyiv (UA); Yuriy E. Rudoy, Kyiv (UA); Leonella M. Nerodenko, Kyiv (UA); Ramgopal Darolia, West Chester, OH (US); Irene Spitsberg, Loveland, OH (US); Anthony Mark Thompson, Niskayuna, NY (US); Curtis Alan Johnson, Niskayuna, NY (US); David John Wortman, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/064,791

(22) Filed: Aug. 16, 2002

(65) Prior Publication Data

US 2003/0129378 A1 Jul. 10, 2003

(30) Foreign Application Priority Data

Jan. 9, 2002 (UA) ............................. 2002010240

(51) Int. Cl.
*B32B 3/26* (2006.01)

(52) U.S. Cl. .............................. 428/305.5; 428/307.3; 428/307.7; 428/314.4; 428/319.1; 428/689; 428/697; 428/698; 428/699

(58) Field of Classification Search ............. 428/317.9, 428/319.1, 312.2, 698, 699, 305.5, 307.3
See application file for complete search history.

(56) References Cited

U.S. PATENT DOCUMENTS

| 5,296,274 A | 3/1994 | Movchan et al. ........ 427/274 X |
| 5,418,003 A | 5/1995 | Bruce et al. ................ 427/566 |
| 5,512,382 A * | 4/1996 | Strangman ................. 428/632 |
| 5,683,825 A | 11/1997 | Bruce et al. ................ 428/698 |

(Continued)

FOREIGN PATENT DOCUMENTS

JP         02301550         12/1990

OTHER PUBLICATIONS

Translation of JP 02-301550, Jiro Harada, "HIP treatment Method of Plasma-Flame Sprayed Ceramic Films," Dec. 13, 1990. 6 pages.*

*Primary Examiner*—Hai Vo
(74) *Attorney, Agent, or Firm*—David L. Narcisco; Gary M. Hartman; Domenica N.S. Hartman

(57) ABSTRACT

A thermal barrier coating (TBC 26) and method for forming the TBC (26) on a component (10) characterized by a stabilized microstructure that resists grain growth, sintering and pore coarsening or coalescence during high temperature excursions. The TBC (26) contains elemental carbon and/or a carbon-containing gas that increase the amount of porosity (32) initially within the TBC (26) and form additional fine closed porosity (32) within the TBC (26) during subsequent exposures to high temperatures. A first method involves incorporating elemental carbon precipitates by evaporation into the TBC microstructure. A second method is to directly incorporate an insoluble gas, such as a carbon-containing gas, into an as-deposited TBC (26) and then partially sinter the TBC (26) to entrap the gas and produce fine stable porosity within the TBC (26).

11 Claims, 3 Drawing Sheets

U.S. PATENT DOCUMENTS

| | | |
|---|---|---|
| 5,906,895 A | 5/1999 | Hamada et al. ............. 428/610 |
| 6,042,951 A * | 3/2000 | Kojima et al. .............. 428/633 |
| 6,251,504 B1 * | 6/2001 | Jaslier et al. ............... 428/210 |
| 6,312,832 B1 | 11/2001 | Alperine et al. ............ 428/633 |
| 6,492,038 B1 * | 12/2002 | Rigney et al. .............. 428/627 |
| 6,808,799 B1 * | 10/2004 | Darolia et al. ........... 428/305.5 |

* cited by examiner

THERMALLY-STABILIZED THERMAL BARRIER COATING

BACKGROUND OF INVENTION

This invention relates to thermal-insulating coatings for components exposed to high temperatures, such as the hostile thermal environment of a gas turbine engine. More particularly, this invention is directed to a method of stabilizing the microstructure of a thermal barrier coating (TBC) through the co-deposition of elemental carbon to produce additional fine stable porosity in the TBC, leading to lower thermal conductivity and greater resistance to degradation of insulating properties during high temperature excursions.

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack, and as a result may not retain adequate mechanical properties. For this reason, these components are often protected by a thermal barrier coating (TBC) system. TBC systems typically include an environmentally-protective bond coat and a thermal-insulating ceramic topcoat, typically referred to as the TBC. Bond coat materials widely used in TBC systems include oxidation-resistant overlay coatings such as MCrAlX (where M is iron, cobalt and/or nickel, and X is yttrium or another rare earth element), and oxidation-resistant diffusion coatings such as diffusion aluminides that contain nickel-aluminum (NiAi) intermetallics.

Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques. In plasma spraying processes, the coating material is typically in the form of a powder that is melted by a plasma as it leaves a spray gun. As a result, a plasma-sprayed TBC is formed by a buildup of molten "splats" and has a microstructure characterized by irregular flattened grains and a degree of inhomogeneity and porosity. TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

In order for a TBC to remain effective throughout the planned life cycle of the component it protects, it is important that the TBC has and maintains a low thermal conductivity throughout the life of the component, including during high temperature excursions. However, the thermal conductivities of TBC materials such as YSZ are known to increase over time when subjected to the operating environment of a gas turbine engine. As a result, TBC's for gas turbine engine components are often deposited to a greater thickness than would otherwise be necessary. Alternatively, internally cooled components such as blades and nozzles must be designed to have higher cooling flow. Both of these solutions are undesirable for reasons relating to cost, component life and engine efficiency. As a result, it can be appreciated that further improvements in TBC technology are desirable, particularly as TBC's are employed to thermally insulate components intended for more demanding engine designs.

U.S. Pat. No. 5,906,895 to Hamada et al. discloses a method of inhibiting the deterioration of the thermal properties of a TBC by suppressing a reaction sintering mechanism said to occur in TBC's at high temperatures. In Hamada et al., a high temperature compound (such as a carbide, nitride or another high temperature material) is said to be compounded into a YSZ TBC deposited by a plasma spraying process. According to three plasma spraying techniques disclosed by Hamada et al., the high temperature compound appears to be present as splats dispersed within the TBC as a result of the plasma spraying process. According to a fourth technique disclosed by Hamada et al., a plasma-sprayed TBC is infiltrated with a feed gas of the high temperature compound, apparently forming a coating of the compound on the inter-splat boundaries of the porous TBC. Following this treatment, any remaining feed gas would inherently escape the TBC through the same passages that allowed the gas to infiltrate the TBC. With each approach, the high temperature compound is said to suppress reaction sintering of the YSZ TBC by some unexplained mechanism.

In commonly-assigned U.S. Pat. No. 6,492,038 to Rigney et al., a more thermally-stable TBC is achieved by inhibiting grain growth (coarsening), sintering, and pore redistribution (the coalescence or coarsening of smaller pores to form larger pores) during high temperature excursions. According to Rigney et al., resistance to heat transfer through a TBC is determined in part by the amount of microstructural defects within the grains of the TBC. Rigney et al. teach that such defects can be created by composition-induced defect reactions and process-induced porosity, the former of which includes vacancies that result from the need in ionic solids to maintain charge neutrality, as is the case in YSZ where substitution of zirconia ($ZrO_2$) with yttria ($Y_2O_3$) in the lattice yields a vacancy. On the other hand, process-induced porosity includes pore formation that occurs during coating as a component is rotated relative to the deposition source. A primary example is the "sunrise-sunset" vapor-surface mechanisms that occur during rotation of a component during deposition of TBC from a vapor cloud, such as by PVD, the result of which is a textured growth of the deposit in which pores are formed between columns, within the columns, and between secondary growth arms contained within the columns.

Rigney et al. teach a technique by which process-induced porosity in a TBC is preserved by incorporating extremely fine precipitates into the TBC microstructure. More particularly, Rigney et al. teach that limited amounts of extremely fine carbide and/or nitride precipitates formed at the defects, pores and grain boundaries of the TBC microstructure serve to pin the TBC grain boundaries to inhibit sintering, grain coarsening and pore redistribution during high temperature excursions, with the effect that the microstructure, and consequently the thermal conductivity of the TBC, is stabilized. Rigney et al. teach that suitable carbiding/nitriding techniques include depositing the TBC using a physical vapor deposition technique in an atmosphere that contains carbon and/or nitrogen vapors, gases or compounds, and/or heat treating in the presence of a gas containing carbon and/or nitrogen gases or compounds. Contrary to Hamada et al., the carbide/nitride precipitates must be incorporated as extremely fine precipitates in order to pin the TBC grain boundaries.

While the incorporation of carbide/nitride precipitates in accordance with Rigney et al. makes possible a more stabilized TBC microstructures, further improvements in TBC microstructure and processes would be desirable to promote thermal stability, which would allow for the use of thinner TBC and/or, where applicable, lower cooling air flow rates, thereby reducing processing and material costs and promoting component life and engine efficiency.

SUMMARY OF INVENTION

The present invention generally provides a thermal barrier coating (TBC) and method for forming the coating on a component intended for use in a hostile environment, such as the superalloy turbine, combustor and augmentor components of a gas turbine engine. The method of this invention is particularly directed to producing a more stabilized TBC microstructure by inhibiting grain growth, sintering and pore coarsening or coalescence in the TBC during high temperature excursions. Improvements obtained by this invention are particularly evident with TBC having a columnar grain structure, such as those deposited by EBPVD and other PVD techniques, though the invention is also applicable to TBC deposited by such methods as plasma spraying.

The invention generally entails a TBC whose microstructure contains elemental carbon and/or a carbon-containing gas that increase the amount of porosity initially within the TBC and form additional fine closed porosity within the TBC during subsequent exposures to high temperatures. The invention further entails a method by which elemental carbon precipitates and possibly carbide precipitates are incorporated by evaporation into a TBC microstructure. According to the invention, when elemental carbon is co-deposited by EBPVD with the thermal-insulating material of the TBC, fine sub-grain microstructures are created within the TBC, along with numerous fine linear pores at sites where carbon or carbide clusters were deposited. This porosity (both open and closed) is attributed to a "shadowing" effect occurring as a result of the EBPVD process. At these sites, additional fine and stable porosity have been observed to form during subsequent high temperature excursions in which sintering of the TBC occurs. This additional porosity is believed to be the result of carbon-containing gases produced from the decomposition of the elemental carbon clusters (and possibly carbide clusters) at high temperatures and, as a result of being insoluble in the TBC material, are trapped within the TBC due to partial sintering of the TBC material, during which fine porosity originally within a prior art TBC is often lost through a process of pore coarsening (coalescence). The pressure exerted by the entrapped gas on the surrounding TBC material is believed to inhibit pore coarsening and redistribution in the microstructure, such that the TBC retains fine porosity and the microstructure of the TBC is thermally stabilized. In view of this desirable effect attributed to entrapped gas, the present invention also encompasses processes that directly incorporate an insoluble gas, such as a carbon-containing gas, into an as-deposited TBC microstructure, and then intentionally partially sintering the TBC to entrap the gas and produce fine stable porosity within the TBC.

In view of the above, though produced as a direct result of sintering that would normally be associated with an increase in thermal conductivity, additional fine porosity is produced with the methods of this invention to counteract the undesirable effect of sintering, thereby maintaining and potentially increasing porosity to maintain or decrease the thermal conductivity of a TBC. As a result, components can be designed for thinner TBC and/or, where applicable, lower cooling air flow rates, which reduces processing and material costs and promotes component life and engine efficiency.

Other objects and advantages of this invention will be better appreciated from the following detailed description.

DETAILED DESCRIPTION

Figure 1:
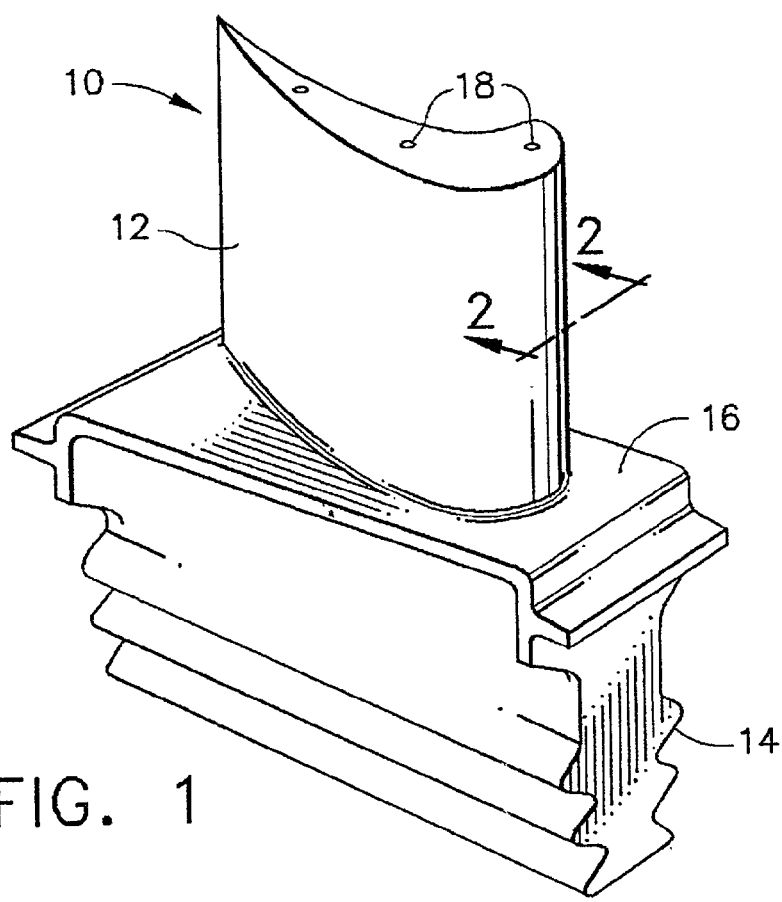
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
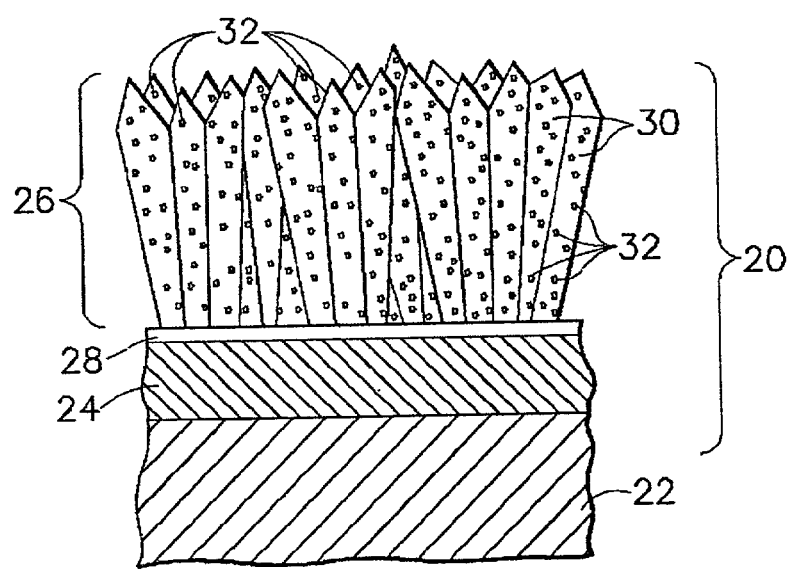
FIG. 2 schematically represents a cross-sectional view of the blade of FIG. 1 along line 2—2, and shows a thermal barrier coating system on the blade in accordance with the invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is preferably an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a thermal-insulating material, or TBC 26, to the bond coat 24 and substrate 22. The TBC 26 of FIG. 2 is represented as having a strain-tolerant microstructure of columnar grains 30. As known in the art, such columnar microstructures can be achieved by depositing the TBC 26 using a physical vapor deposition technique, such as EBPVD. While much of the following discussion will focus on columnar TBC of the type represented by FIG. 2, the invention is also believed to be applicable to noncolumnar TBC deposited by such methods as plasma spraying, including air plasma spraying (APS). A TBC of this type is in the form of molten "splats," resulting in a microstructure characterized by irregular flattened grains and a degree of inhomogeneity and porosity.

A preferred thermal-insulating material for the TBC 26 is based on binary yttria-stabilized zirconia (YSZ), and particularly zirconia partially stabilized by yttria. Other ceramic materials could also be used with this invention, such as zirconia fully stabilized by yttria, nonstabilized zirconia, or zirconia partially or fully stabilized by ceria, magnesia, scandia and/or other oxides. According to one aspect of the invention, a particularly suitable material for the TBC is YSZ containing about 4 to about 8 weight percent yttria. The TBC 26 is deposited to a thickness that is sufficient to provide the required thermal protection for the underlying substrate 22 and blade 10, generally on the order of about 75 to about 300 micrometers.

As a result of the processes by which the TBC 26 is deposited, the individual grains 30 of the TBC 26 are characterized by microstructural defects and pores 32 within the grains 30 and at and between the grain boundaries. The defects and pores 32 are believed to decrease the thermal conductivity of a TBC grain 30, and therefore the TBC 26 as a whole. A first aspect of the present invention is to increase the amount of as-deposited open porosity within the TBC 26. A second aspect of the invention is to maintain or increase the amount of porosity in the TBC microstructure and to stabilize the TBC microstructure during high temperature excursions that would otherwise cause grain growth (coarsening), sintering and pore redistribution, leading to coarsening and/or elimination of the desirable defects and pores 32. Both of these aspects can be achieved with this invention through the co-deposition of elemental carbon during the coating deposition process. According to the invention, an increased amount of fine open porosity can be produced in the as-deposited TBC 26 by co-depositing elemental carbon and the insulating material (e.g., YSZ) of the TBC 26, and additional fine porosity forms during subsequent exposures to high temperatures as a result of insoluble carbon-containing gases evolving from the carbon and then becoming entrapped within the TBC 26 as a result of partial sintering of the TBC 26. Alternatively, the second aspect can be achieved by directly incorporating an insoluble gas into the TBC 26 through an infiltration process, and then partially sintering the TBC 26 to entrap the infiltrated gas.

A preferred method for co-depositing carbon and the thermal-insulating material of the TBC 26 is by the evaporation of one or more ingots of the thermal-insulating material and carbon and/or a carbon compound. An example of a suitable carbon source is graphite, while suitable carbon compounds include zirconium carbide (ZrC), titanium carbide (TiC), tantalum carbide (TaC), and molybdenum carbide ($Mo_2C$). The resulting added porosity is believed to be the result of a shadowing effect that occurs when two insoluble phases are deposited by EBPVD. More particularly, "primary" porosity is believed to be created surrounding deposited elemental carbon clusters (and possibly clusters of carbides, carbonitrides, nitrides, etc., all of which are insoluble in YSZ) during EBPVD as a result of zirconia vapor flux being blocked from the immediate vicinity of the second phase clusters. Another benefit of co-deposition of carbon clusters (and possibly carbide clusters) by EBPVD has been observed to be the formation of many additional interfaces associated with sub-grain boundaries, possibly due to what appears to be related to the presence of carbon promoting the nucleation of new sub-grains and inhibiting diffusion processes of grain growth. The result is a continuous nucleation of new grains, which produces a fine sub-grained TBC structure with numerous interfaces that reduce thermal conductivity through the TBC grains. Open porosity levels observed within TBC deposited in accordance with this invention are well in excess of YSZ TBC deposited from an identical YSZ source material (minus the carbon source) under identical conditions. While YSZ TBC is typically deposited by EBPVD to have open porosity levels of not more than about 15 to 20 volume percent, open porosity levels on the order of at least about 25 volume percent are believed to be possible with the present invention, with typical open porosity levels being about 30 to about 35 volume percent.

Fine "secondary" porosity occurs with this invention as a result of elemental carbon (and possibly carbides) reacting with oxygen to form carbon monoxide (CO) and/or another carbon-containing gas (e.g., carbon dioxide; $CO_2$) during high temperature excursions (e.g., above about 950° C.). As a result of the primary porosity surrounding the deposited carbon, there is sufficient pore volume for carbon monoxide to evolve and produce very fine pores ("micropores") within the TBC. As carbon monoxide forms and some of the original primary porosity is lost as a result of pore coarsening and redistribution during sintering, some of the carbon monoxide is entrapped within the micropores. The entrapped gas is believed to counteract surface tension energies that are the driving force for pore coarsening (coalescing) during sintering. Therefore, in addition to reducing the density and thermal conductivity of the TBC 26, the added fine porosity made possible with this invention is thermally stable, i.e., not susceptible to shrinkage.

Additional porosity may also be generated in part through one or both of the following reactions:

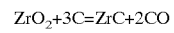

$ZrO_2+3C=ZrC+2CO$

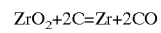

$ZrO_2+2C=Zr+2CO$

These reactions have been reported in the art as occurring within a temperature range of about 900° C. to about 1200° C. if a sufficiently low vacuum of about $10^{-4}$ to $10^{-5}$ Torr (about $1.33\times10^{-4}$ to $1.33\times10^{-5}$ mbar) is maintained (because the equilibrium pressure of carbon monoxide is very low, e.g., about $10^{-4}$ Torr at 870° C.). According to this theory, zirconium and zirconium carbide would form during deposition by EBPVD under these conditions, and primary porosity would also form around these particles as a result of the shadowing effect during the EBPVD process. During subsequent heating, gaseous carbon monoxide would then form, resulting in new secondary porosity within the TBC 26 and its grains 30, as well as carbon monoxide (and/or carbon dioxide or another carbon-containing gas) entrapped within micropores that are remnants of the original primary porosity. Carbides (e.g., ZrC) and oxycarbides (e.g., $ZrO_xC_y$) are also potential byproducts of the above reactions, and may serve to stabilize the micropore structure of the TBC 26 by anchoring and pinning the grain boundaries and pores 32 of the TBC 26.

As noted previously, at least some of the benefits made possible with the present invention can also be obtained by directly incorporating an insoluble gas into the TBC 26, and then partially sintering the TBC 26 to entrap the gas and produce fine stable secondary porosity within the TBC 26. Suitable gases for this purpose include carbon monoxide, carbon dioxide, sulfur dioxide, nitrogen and argon, which can be introduced into the TBC 26 during deposition of the TBC 26 or during a post-deposition process. In either case, a heating step must be intentionally performed to cause at least partial sintering of the TBC 26 in order to close the open porosity that allowed the gas to permeate the TBC 26, thereby preventing the gas from escaping. For example, in a post-deposition process, the TBC 26 could be placed under vacuum in a chamber, and then the insoluble gas introduced into the chamber to infiltrate the open porosity of the TBC 26. The porosity would then be closed by heating the TBC 26 (preferably in an atmosphere of the insoluble gas) to a temperature of about 950° C. or more for a YSZ TBC. Once closed, the pores containing the gas would be stabilized against further densification by the pressure of the entrapped insoluble gas.

While the above discussion is primarily directed to columnar TBC of the type represented by FIG. 2, the benefits of the invention may also be achieved with noncolumnar TBC, as when deposited by such methods as plasma spraying. As previously discussed, a plasma-sprayed TBC is deposited as molten "splats" that produces a grain structure characterized by irregular flattened grains surrounded by inhomogeneous porosity. With the present invention, an effective amount of porosity can be maintained to stabilize the TBC microstructure during high temperature excursions by co-depositing powders of elemental carbon or carbon-based compounds and the TBC material, such as by simultaneously spraying graphite and YSZ powders or spraying a graphite-coated YSZ powder. An insoluble carbon-containing gas would then be evolved and some of the existing open porosity closed during a subsequent thermal treatment that is sufficient to partially sinter the TBC. Alternatively, an insoluble gas could be directly incorporated into the TBC 26 in a post-deposition process as described above. In either case, the process and result differs from that of U.S. Pat. No. 5,906,895 to Hamada et al., in that Hamada et al. teach forming a plasma-sprayed TBC that either contains splats of carbides or another high temperature compound, or is infiltrated with a feed gas to form a coating of carbides (or another high temperature compound) on the inter-splat boundaries of the TBC. Neither of these TBC's could contain entrapped gas because of the open porous nature of the plasma-sprayed TBC.

In an investigation leading to this invention, YSZ TBC was deposited by EBPVD on, specimens formed-of the superalloy Ren é N5 on which a platinum aluminide (PtAl) bond coat had been deposited. Some of the specimens were coated by co-evaporating separate ingots of graphite and 7% YSZ (zirconia stabilized by about 7 wt. % yttria). The graphite ingot included a tungsten cap which, during EBPVD, forms a molten surface pool through which carbon evaporates in accordance with U.S. Pat. No. 5,296,274 to Movchan et al. Similar to EBPVD processes of the past, the specimens were loaded into a coating chamber so as to be supported above the ingots, and the chamber evacuated to achieve a partial vacuum of about $4.7 \times 10^{-4}$ to about $6.6 \times 10^{-4}$ Torr (about $6.3 \times 10^{-4}$ to about $8.8 \times 10^{-4}$ mbar). The chamber was then heated to a temperature of between about 900° C. and 1000° C. and, while the specimens were rotated at a rate of about 25 rpm, two electron beam guns were operated at power levels of about 19.5 kW and 23 kW to project electron beams onto the YSZ and graphite ingots, respectively, so as to melt the ingot surfaces and produce a vapor cloud containing zirconia, zirconium monoxide, zirconium, yttrium, yttria, yttria suboxides, oxygen and carbon. The vapors deposited (condensed) on the specimen surfaces to form TBC's whose thicknesses were on the order of about 150 micrometers. Each of the resulting coatings (referred to below as 7% YSZ+C) contained a dispersion of carbon (solid graphite) and possibly zirconium carbide, which congregated at the defects, pores and sub-grains (interfaces within the grains) of the YSZ microstructure during growth of the individual grains. The amount of carbon deposited (identified as "low," "medium" or "high" below) was determined by the position of each specimen relative to the graphite pool, with those closer to the graphite pool receiving a higher concentration of carbon than those closer to the YSZ pool. Additional specimens were coated in the same manner described above, but with only an ingot of 7% YSZ being evaporated to deposit a conventional 7% YSZ TBC.

Figure 3:
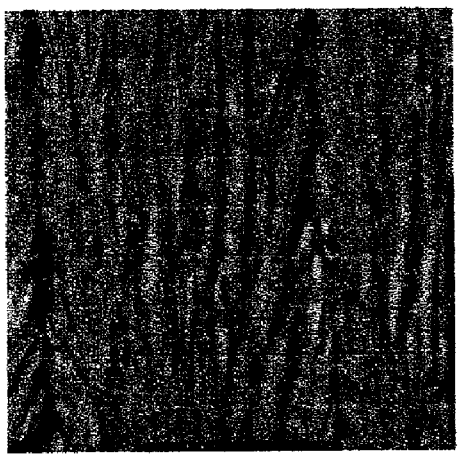
FIGS. 3 and 4 are microphotographs of thermal barrier coatings deposited in accordance with this invention and the prior art, respectively, in the as-deposited condition.
Figure 4:
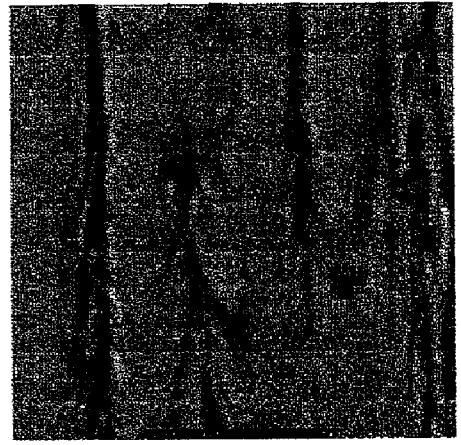
Figure 5:
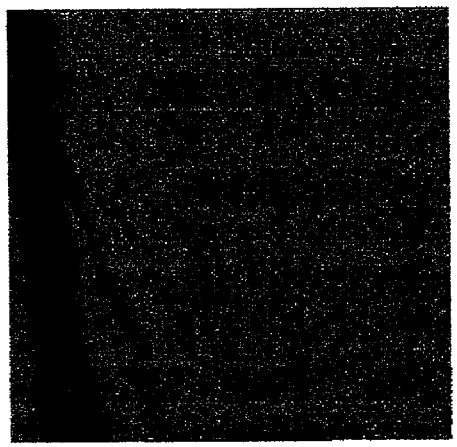
FIGS. 5 and 6 are microphotographs of the thermal barrier coatings of FIGS. 3 and 4, respectively, following heat treatment at about 1200° C. for about two hours.
Figure 6:
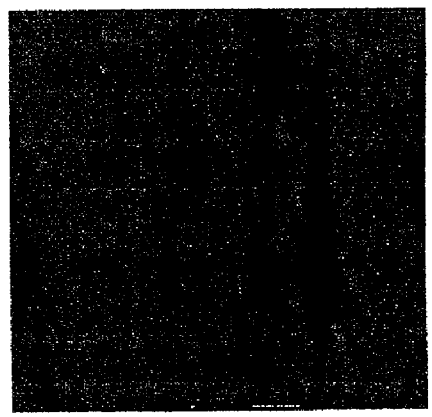

FIGS. 3 and 4 are 5000× microphotographs of one of each of the as-coated 7% YSZ+C and 7% YSZ specimens, respectively. The open porosity of the 7% YSZ+C specimens was measured to be about 32 volume percent, as compared to about 12 volume percent for the conventional 7% YSZ specimens. The specimens then underwent aging at about 1200° C. for about two hours. FIGS. 5 and 6 are 5000×microphotographs of aged 7% YSZ and 7% YSZ+C specimens, respectively. From a comparison of FIGS. 3 and 5, it can be seen that a fine scale porosity formed in the 7% YSZ+C specimens, which was attributed to be the result of a reaction between carbon and oxygen that had diffused into the TBC. The amount of carbon deposited appeared to affect the density of the TBC following aging, with TBC's containing lower, medium and higher carbon concentrations having average densities of about 4.835, 4.615 and 4.555 g/cc, respectively.

Figure 7:
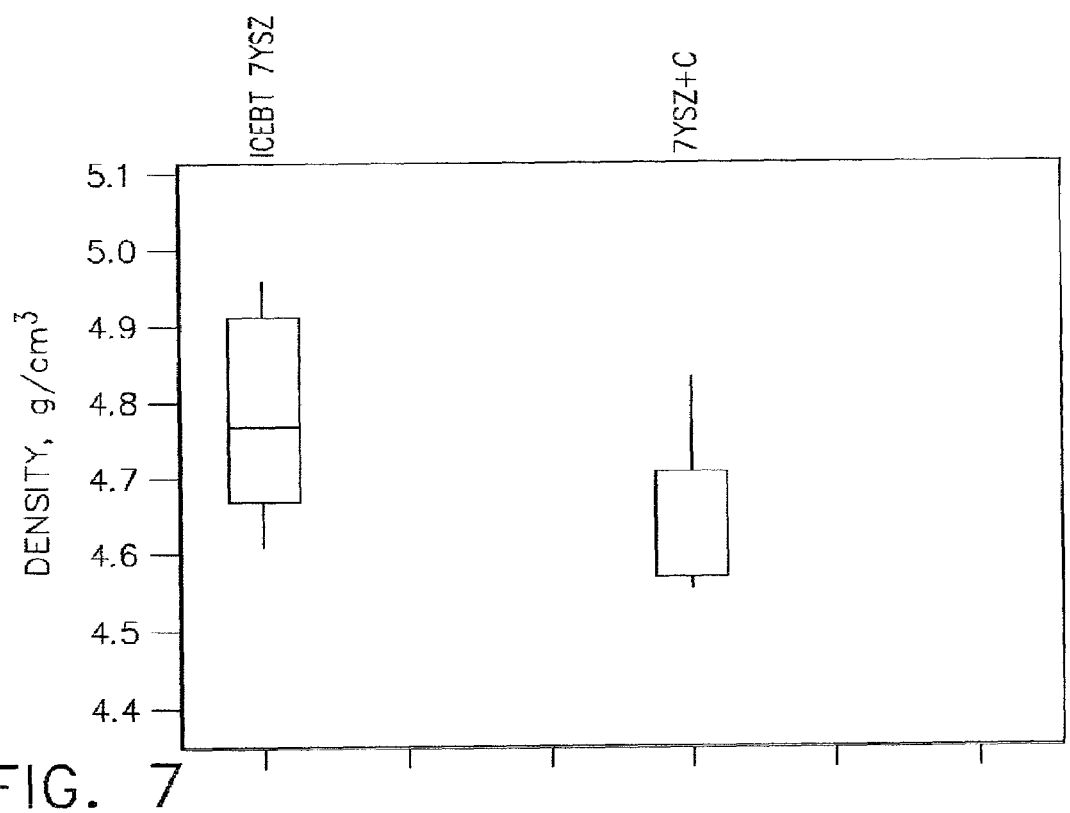
FIGS. 7 and 8 are graphs comparing the thermal conductivities and densities, respectively, of thermal barrier coatings formed in accordance with the prior art and the present invention.
Figure 8:
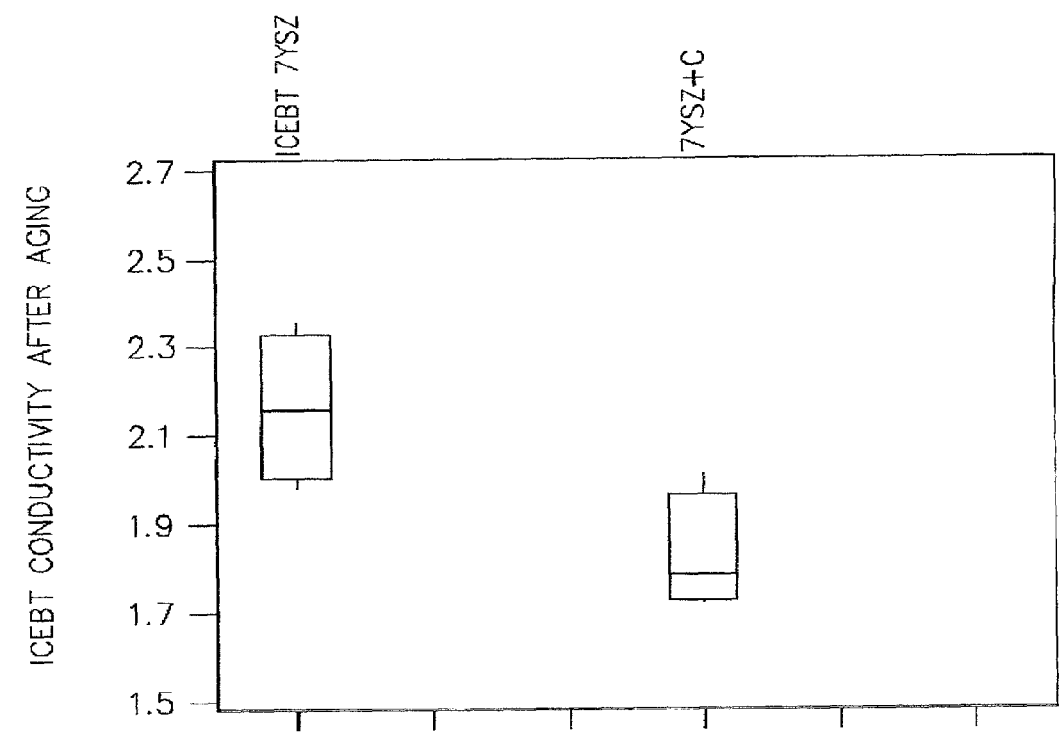

Following aging at about 1200° C. for about two hours, the thermal conductivity and density of each specimen was measured. The resulting data are summarized in FIGS. 7 and 8, which plot ranges, standard deviations and averages. Thermal conductivities for the 7% YSZ+C and baseline 7% YSZ specimens were measured at about 890° C. and are summarized in Table I below. The "% difference" value is based on the average conductivity of the 7% YSZ+C specimens relative to the baseline 7% YSZ specimens.

TABLE I

| Specimen   | Avg. (W/mK) | Std. Dev | % Difference |
|------------|-------------|----------|--------------|
| 7% YSZ     | 2.2         | 0.17     | —            |
| 7% YSZ + C | 1.8         | 0.13     | −13.0        |

The results from this investigation strongly evidenced the effect that carbon additions have on the thermal conductivity and porosity of a YSZ TBC. The reduced thermal conductivities of the 7% YSZ+C specimens were consistent with the increased porosity observed. The results further evidenced that the 7% YSZ+C specimens had a more "stable" microstructure than the 7% YSZ specimens, with the result that the 7% YSZ+C specimens maintained their lower conductivities during aging at 1200° C.

While the invention has been described in terms of a preferred embodiment, it is apparent that other forms could be adopted by one skilled in the art. Accordingly, the scope of the invention is to be limited only by the following claims.

The invention claimed is:

1. A thermal barrier coating on a surface of a component, the thermal barrier coating comprising a ceramic thermal-insulating material having a columnar microstructure with pores and sub-grain interfaces within, at and between grain boundaries of the microstructure, wherein at least some of the pores throughout the thermal-insulating material are closed by sintering to entrap clusters of element carbon and a carbon-containing gas that is insoluble in the thermal-insulating material, wherein the entrapped clusters and the insoluble gas are present substantially throughout the thermal-insulating material in an amount sufficient to thermally stabilize the microstructure of the thermal-insulating material.

2. A thermal barrier coating according to claim 1, further comprising clusters of carbides entrapped within some of the pores that were closed by sintering.

3. A thermal barrier coating according to claim 1, wherein at least some of the pores closed by sintering entrap sulfur dioxide gas and/or nitrogen gas.

4. A thermal barrier coating according to claim 1, wherein the insoluble gas is at least one gas chosen from the group consisting of carbon monoxide and carbon dioxide.

5. A thermal barrier coating according to claim 1, wherein at least some of the pores closed by sintering entrap at least one gas chosen from the group consisting of sulfur dioxide, nitrogen and argon.

6. A thermal barrier coating according to claim 1, wherein the thermal-insulating material is predominantly yttria-stabilized zirconia.

7. A thermal barrier coating on a surface of a superalloy component, the thermal barrier coating comprising:

a bond coat on the component; and a ceramic thermal-insulating material having a columnar microstructure with pores and sub-grain interfaces within, at and between grain boundaries of the microstructure, wherein at least some of the pores throughout the thermal-insulating material are closed by sintering to entrap clusters of element carbon and a carbon-containing gas that inhibit further sintering, grain coarsening and pore redistribution within the thermal-insulating material and thereby thermally stabilize the microstructure.

8. A thermal barrier coating according to claim 7, wherein the thermal-insulating material consists of yttria-stabilized zirconia.

9. A thermal barrier coating according to claim 7, wherein at least some of the pores closed by sintering entrap clusters of carbides.

10. A thermal barrier coating according to claim 9, wherein at least some of the pores closed by sintering entrap carbon dioxide or carbon monoxide.

11. A thermal barrier coating according to claim 7, wherein at least some of the pores closed by sintering entrap sulfur dioxide gas or nitrogen gas.

* * * * *